(12) United States Patent
Ozaki

(10) Patent No.: US 10,469,101 B2
(45) Date of Patent: Nov. 5, 2019

(54) LOG COLLECTION DEVICE, LOG GENERATION DEVICE, AND LOG COLLECTION METHOD

(71) Applicant: PANASONIC INTELLECTUAL PROPERTY MANAGEMENT CO., LTD., Osaka (JP)

(72) Inventor: Minoru Ozaki, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/085,410

(22) PCT Filed: Mar. 9, 2017

(86) PCT No.: PCT/JP2017/009411
§ 371 (c)(1),
(2) Date: Sep. 14, 2018

(87) PCT Pub. No.: WO2017/163896
PCT Pub. Date: Sep. 28, 2017

(65) Prior Publication Data
US 2019/0089371 A1  Mar. 21, 2019

(30) Foreign Application Priority Data

Mar. 22, 2016  (JP) ................................ 2016-057033

(51) Int. Cl.
*H03M 7/38* (2006.01)
*H03M 7/30* (2006.01)
(Continued)

(52) U.S. Cl.
CPC .......... *H03M 7/3088* (2013.01); *G06F 11/30* (2013.01); *G06F 11/3082* (2013.01); *G06F 11/34* (2013.01); *G06F 11/3476* (2013.01)

(58) Field of Classification Search
CPC .... H03M 7/3088; G06F 11/30; G06F 11/3082
(Continued)

(56) References Cited

U.S. PATENT DOCUMENTS

| 4,558,302 A | 12/1985 | Welch |
| 6,606,040 B2 | 8/2003 | Adbat |

(Continued)

FOREIGN PATENT DOCUMENTS

| JP | 60-116228 | 6/1985 |
| JP | 2006-287518 | 10/2006 |

(Continued)

OTHER PUBLICATIONS

The Extended European Search Report from the European Patent Office (EPO) dated Feb. 12, 2019 for the related European Patent Application No. 17769941.0.

(Continued)

*Primary Examiner* — Peguy Jean Pierre
(74) *Attorney, Agent, or Firm* — Greenblum & Bernstein, P.L.C.

(57) ABSTRACT

There is provided a log collection device including: a log receiver that receives a text log from a log generation device; a dictionary generator that generates a compressed dictionary for performing text compression based on the received text log; a dictionary transmitter that transmits the generated compressed dictionary to the log generation device and instructs performing of the compression process using the compressed dictionary on the text log transmitted after the transmission of the compressed dictionary; and a decompression processor that performs a decompression process using the compressed dictionary on the text log received after transmission of the compressed dictionary.

6 Claims, 8 Drawing Sheets

(51) Int. Cl.
  *G06F 11/30*  (2006.01)
  *G06F 11/34*  (2006.01)
(58) Field of Classification Search
  USPC .......................................... 341/51, 106, 50
  See application file for complete search history.

(56) References Cited

U.S. PATENT DOCUMENTS

| | | |
|---|---|---|
| 2011/0145313 A1 | 6/2011 | Narayanan et al. |
| 2012/0296983 A1 | 11/2012 | Boehm |
| 2013/0103982 A1* | 4/2013 | Chelliah ............. H03M 7/3088 |
| | | 714/20 |
| 2013/0114626 A1 | 5/2013 | Bellessort et al. |
| 2013/0262487 A1* | 10/2013 | Yamashita .......... G06F 11/3082 |
| | | 707/755 |
| 2015/0180504 A1* | 6/2015 | Kang ..................... H03M 7/30 |
| | | 708/203 |

FOREIGN PATENT DOCUMENTS

| | | |
|---|---|---|
| JP | 2007-087186 | 4/2007 |
| JP | 2014-116780 | 6/2014 |

OTHER PUBLICATIONS

International Search Report (ISR) from International Searching Authority (Japan Patent Office) in International Pat. Appl. No. PCT/JP2017/009411, dated May 30, 2017.

* cited by examiner

| 513 | 511 | | 512 | | 514 | 515 |
|---|---|---|---|---|---|---|
| | DICTIONARY NAME | COMMON DICTIONARY | VERSION | 10 | | |
| | NUMBER | CHARACTER STRING | | | | FREQUENCY |
| | 1 | "rtkit-daemon:[#debug] Sucessfully" | | | | 200 |
| | 2 | "CROND:[#info](root)CMD(/usr/lib64/sa/sa1 1 1)" | | | | 100 |
| | ⋮ | ⋮ | | | | ⋮ |

| 524 | 521 | | 522 | 525 | 523 | 526 |
|---|---|---|---|---|---|---|
| | DICTIONARY NAME | FIRST DEVICE DICTIONARY | DEVICE NUMBER | 1 | VERSION | 1 |
| | NUMBER | CHARACTER STRING | | | | FREQUENCY |
| | 1 | "PC-NSX6000" | | | | 100 |
| | ⋮ | ⋮ | | | | ⋮ |

| DEVICE NAME | DEVICE NUMBER | COMMON DICTIONARY | DEVICE DICTIONARY |
|---|---|---|---|
| FIRST LOG GENERATION DEVICE | 1 | COMMON DICTIONARY Ver.1 | FIRST DEVICE DICTIONARY Ver.1 |
| SECOND LOG GENERATION DEVICE | 2 | COMMON DICTIONARY Ver.2 | SECOND DEVICE DICTIONARY Ver.2 |
| . | . | . | . |
| . | . | . | . |
| . | . | . | . |

531 532 533 534

LOG COLLECTION DEVICE, LOG GENERATION DEVICE, AND LOG COLLECTION METHOD

TECHNICAL FIELD

This disclosure relates to a log collection device that receives/transmits text logs, a log generation device, and a log collection method.

BACKGROUND ART

A device (hereinafter referred to as "log generation device") that generates a log message indicating generation of a predetermined event and transmits the generated log message to another device is used in various fields. A monitoring camera that notifies a server of a central monitoring center when a suspicious person is detected is an example of such a log generation device.

As a data format of the log message, for example, a text format is adopted. Syslog, which describes a log message in ASCII, is an example of such a log message.

However, since the text format log message (hereinafter referred to as "text log") has a relatively large data size, consumption of communication resources between log generation device and a device that receives the log message (hereinafter referred to as "log collection device") becomes a problem. In particular, in a case where one log collection device collects log messages from a large number of log generation devices via a common communication line, in a case where a communication band between the log generation device and the log collection device is narrow, or in a case where a transmission amount of the log message is large, the performance of the entire system may be degraded. In addition, in order to avoid such degradation in performance, the number of log generation devices that can be managed by one log collection device is limited.

Therefore, in a side of the log generation device, it is considered that a lexicographic compression for compressing the log data from data of the text log (hereinafter referred to as "log data") alone is performed, the log data is converted into log data of which the size is compressed, and the log data is transmitted to the log collection device. As such a technique, for example, there is the lexicographic compression (LZW) described in PTL 1. The log collection device performs the decompression of the log data based on the compressed log data alone and restores original log data. Accordingly, it is possible to alleviate the problem described above of consumption of communication resources.

By the way, depending on log generation device, there is a case where it is difficult to have sufficient process capability to perform the lexicographic compression. Therefore, it is desirable to have a technique for enabling low-load text log transmission in a state where an increase in the processing load of the log generation device is suppressed.

An object of this disclosure is to perform at low load transmission of text logs in a case where an increase in the processing load of the log generation device is suppressed.

CITATION LIST

Patent Literature

PTL 1: Japanese Patent Unexamined Publication No. 60-116228

SUMMARY OF THE INVENTION

According to this disclosure, there is provided a log collection device including: a log receiver that receives a text log from a log generation device; a dictionary generator that generates a compressed dictionary for performing text compression based on the received text log; a dictionary transmitter that transmits the generated compressed dictionary to the log generation device and instructs performing of the compression process using the compressed dictionary on the text log transmitted after the transmission of the compressed dictionary; and a decompression processor that performs a decompression process using the compressed dictionary on the text log received after transmission of the compressed dictionary.

According to this disclosure, there is provided a log generation device including: a log generator that generates a text log; a log transmitter that transmits the generated text log to a log collection device; a dictionary receiver that receives a compressed dictionary for performing text compression from the log collection device; and a compression processor that performs compression process using the received compressed dictionary on the text log transmitted after receiving the compressed dictionary.

According to this disclosure, there is provided a log collection method including: a step of receiving a text log from a log generation device; a step of generating a compressed dictionary for performing text compression based on the received text log; a step of transmitting the generated compressed dictionary to the log generation device and instructing to perform a compression process using the compressed dictionary on the text log transmitted after transmission of the compressed dictionary; and a step of performing decompression process using the compressed dictionary on the received text log after transmission of the compressed dictionary.

According to this disclosure, it is possible to transmit the text log with a low load in a case where the increase in the processing load of log generation device is suppressed.

BRIEF DESCRIPTION OF DRAWINGS

FIG. 5 is a diagram illustrating an example of the contents of a common dictionary in this embodiment.

FIG. 6 is a diagram illustrating an example of contents of a device dictionary according to this embodiment.

FIG. 8 is a diagram illustrating an example of contents of dictionary sharing information according to this embodiment.

DESCRIPTION OF EMBODIMENT

Hereinafter, an embodiment will be described in detail with reference to the drawings as appropriate. However, more detailed explanation than necessary may be omitted. For example, detailed explanations of already well-known matters and redundant explanation with respect to substantially the same configuration may be omitted. This is to avoid making the following explanation unnecessarily redundant and to facilitate understanding by those skilled in the art. The accompanying drawings and the following description are provided to enable those skilled in the art to fully understand this disclosure and are not intended to limit the claimed subject matter.

<Overview of System>

First, an overview of a log generation system including a log generation device and a log collection device according to this embodiment will be described.

Figure 1:
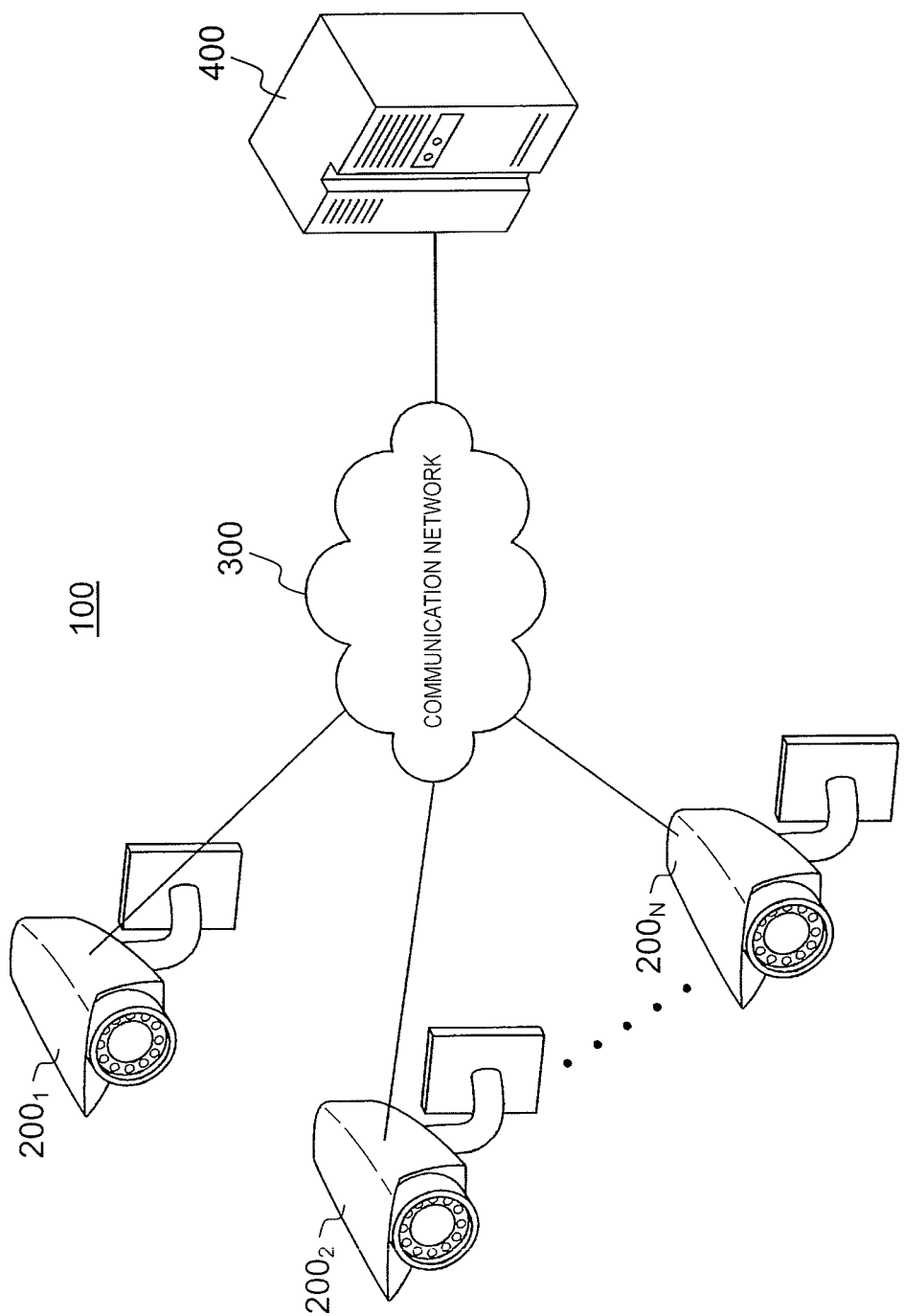
FIG. 1 is a system configuration diagram illustrating an example of a configuration of a log collection system according to this embodiment.

FIG. 1 is a system configuration diagram illustrating an example of a configuration of the log collection system.

In FIG. 1, log collection system 100 has first to Nth log generation devices 2001 to 200N, and log collection server (log collection device) 400 which is communicably connected to each of first to Nth log generation devices 2001 to 200N via communication network 300. Since first to Nth log generation devices 2001 to 200N have the same configuration, the first to Nth log generation devices will be collectively described below as "log generation device 200" as appropriate.

Log generation device 200 generates a text log and transmits the generated text log data (log data) to log collection server 400. Log generation device 200 is, for example, a monitoring camera with infrared sensors installed at various places in a building.

Communication network 300 is a communication line connected to first to Nth log generation devices 2001 to 200N and log collection server 400. Communication network 300 is, for example, a Local Area Network (LAN) laid in the building described above.

Log collection server 400 receives the log data sent from log generation device 200 and collects text logs from first to Nth log generation devices 2001 to 200N by the reception of the log data. Log collection server 400 is, for example, an information process device installed in a management center of the building described above.

Log collection system 100 reduces the transmission load of communication network 300 by compressing the data size of the log data in log generation device 200. However, log collection system 100 does not perform dictionary compression in log generation device 200, but generates a compressed dictionary based on the log data received in log collection server 400, and uses the generated compressed dictionary to log generation device 200.

Figure 2:
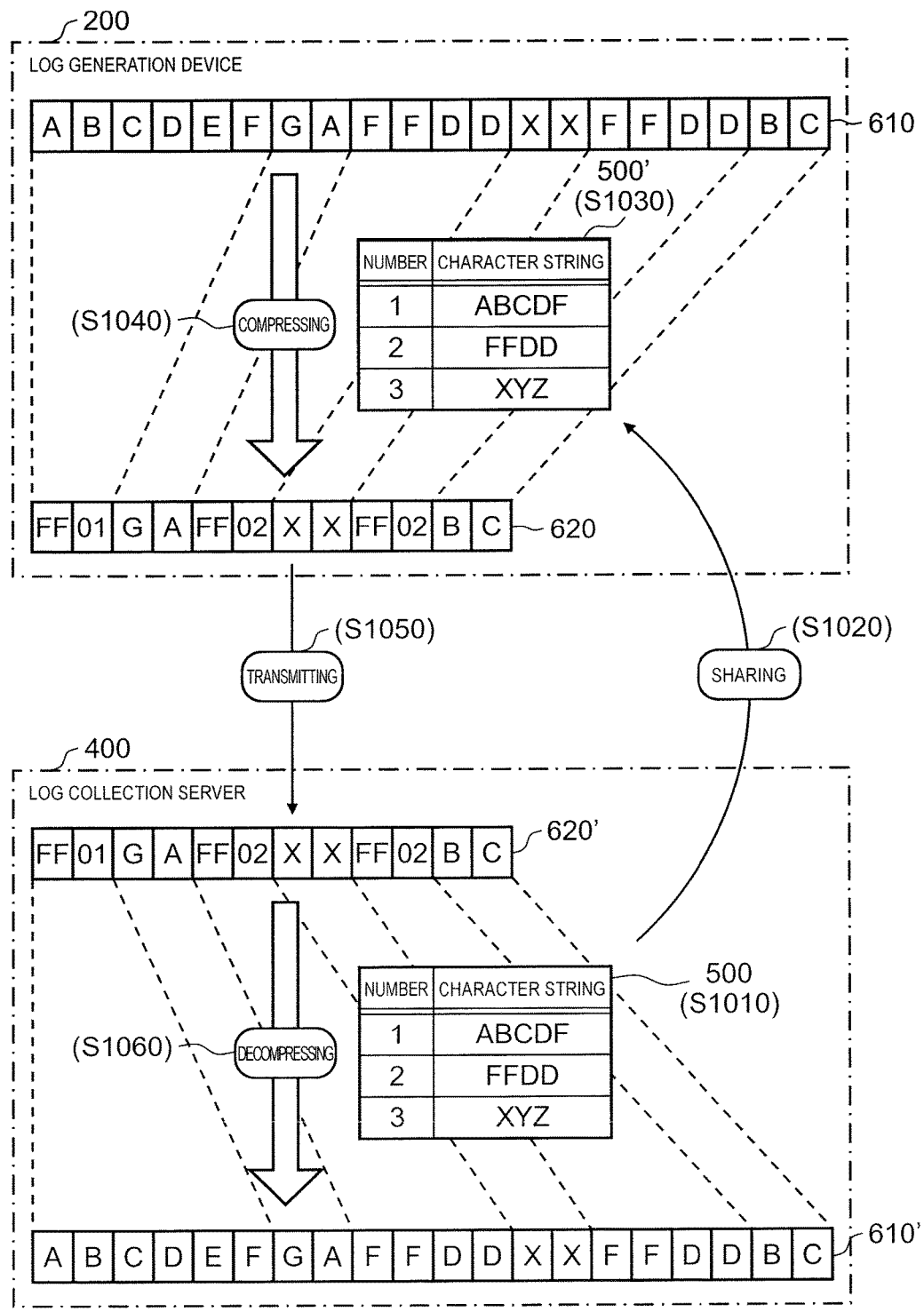
FIG. 2 is a schematic diagram illustrating an overview of processing with respect to log data in this embodiment.

FIG. 2 is a schematic diagram illustrating an overview of processing with respect to log data in log collection system 100.

As illustrated in FIG. 2, log collection server 400 generates and holds compressed dictionary 500 based on the log data (not illustrated) received in the past from log generation device 200 (S1010). Then, log collection server 400 transmits and shares generated compressed dictionary 500 to log generation device 200 (S1020).

Log generation device 200 holds shared compressed dictionary 500' (S1030) and performs text compression using such a compressed dictionary 500' on log data 610 (S1040). Then, log generation device 200 transmits log data 620 generated by process of such a text compression to log collection server 400 (S1050).

Log collection server 400 performs decompression process using held compressed dictionary 500 on log data 620' received from log generation device 200 (S1060). Then, log collection server 400 acquires log data 610' generated by such a decompression process as original log data 610.

As a generation method of compressed dictionary 500, for example, a dictionary generation method can be adopted which replaces a character string having a high frequency of appearance with "0xff"+1 byte 256 types of index numbers based on the text compression method described in PTL 1. If the most significant bit is 1, log collection server 400 may adopt a variable length index number as the converted character string such that the 1 byte 256 types of index numbers described above are further extended by 1 byte.

In addition, in this case, as a method of text compression, when "0xff" is included in log data 610, the subsequent index number is searched by compressed dictionary 500' and the corresponding character string is searched, and in other cases, it is possible to adopt a method of keeping the code of the log data as it is.

Such a log collection server 400 can transmit the log data whose data size is compressed while reducing the processing load of log generation device 200. The process of generating compressed dictionary 500 is concentrated on log collection server 400 and log collection server 400 has process capability that can withstand the concentration of such process.

<Configuration of Device>

Next, a configuration of each device will be described.

Figure 3:
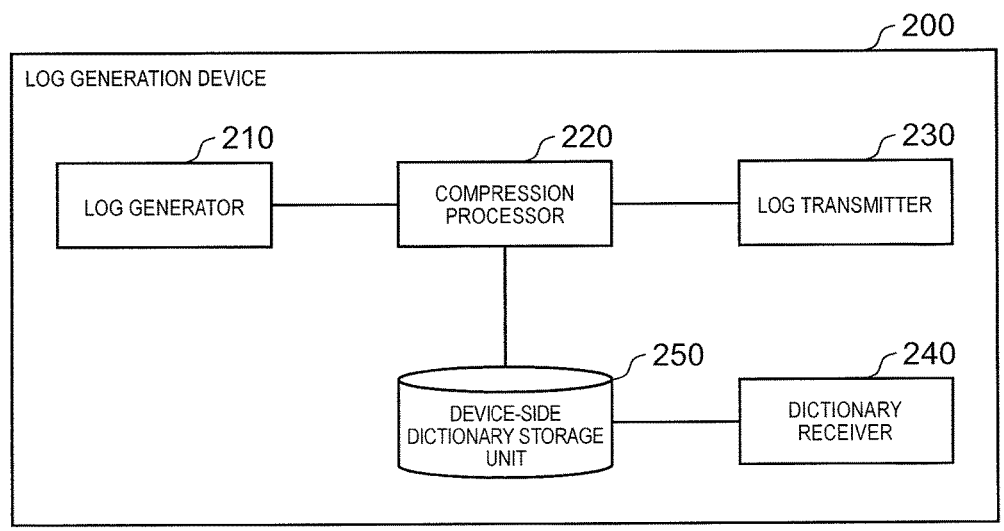
FIG. 3 is a block diagram illustrating an example of a configuration of a log generation device according to this embodiment.

FIG. 3 is a block diagram illustrating an example of the configuration of log generation device 200.

In FIG. 3, log generation device 200 has log generator 210, compression processor 220, log transmitter 230, dictionary receiver 240, and device-side dictionary storage unit 250.

Log generator 210 generates a text log and outputs the log data to compression processor 220. Log generator 210 includes, for example, a video camera, an image processor, and an infrared sensor (none of which are illustrated), and, based on image analysis with respect to the captured image and sensor signals, detects generation of various events such as the appearance of suspicious individuals and generates log data indicating generation of such an event.

Compression processor 220 performs compression process using the compressed dictionary stored in device-side dictionary storage unit 250 to be described below on the log data output from log generator 210 and outputs the compressed log data obtained by such a process to log transmitter 230.

Log generation device 200 stores the compressed dictionary received from log collection server 400 in device-side dictionary storage unit 250 as described below. Therefore, compression processor 220 performs the compression process using the compressed dictionary on the log data transmitted after receiving the compressed dictionary. In a case where there is no compressed dictionary in device-side dictionary storage unit 250, compression processor 220 outputs the log data output from log generator 210 to log transmitter 230 as it is. In addition, compression processor 220 also outputs the log data portion that does not exist in the compressed dictionary stored in device-side dictionary storage unit 250 to log transmitter 230 as it is.

Log transmitter 230 transmits the log data output from compression processor 220 to the log collection device in a case where the identification information of log generation device 200 is added thereto. Such log data includes uncompressed log data and compressed log data.

Dictionary receiver 240 receives a compressed dictionary for performing compression process by text compression from log collection device 400. Then, dictionary receiver 240 outputs the received compressed dictionary to device-side dictionary storage unit 250.

Dictionary receiver 240 may wait for and receive the compressed dictionary autonomously sent from log collection server 400, or perform reception of compressed dictionary by requesting log collection server 400 to transmit a compressed dictionary. Particularly in the former case, it is preferable that dictionary receiver 240 performs a response indicating whether the compressed dictionary has been received to log collection server 400.

Device-side dictionary storage unit 250 stores and holds the compressed dictionary output from dictionary receiver 240. The compressed dictionary is used by compression processor 220 as described above. In addition, when a new compressed dictionary of the same type (common dictionary/device dictionary) as the already stored compressed dictionary is output from dictionary receiver 240, device-side dictionary storage unit 250 updates the corresponding existing compressed dictionary in the new compressed dictionary.

In addition, although not illustrated, log generation device 200 has, for example, a storage medium such as a Central Processor (CPU), a Read Only Memory (ROM) storing a control program, a work memory such as a Random Access Memory (RAM), and a communication circuit. In this case, the function of each of the units described above is realized by the CPU executing the control program.

With such a configuration, log generation device 200 can compress the log data to be transmitted using the compressed dictionary acquired from log collection server 400 without creating a compressed dictionary.

Figure 4:
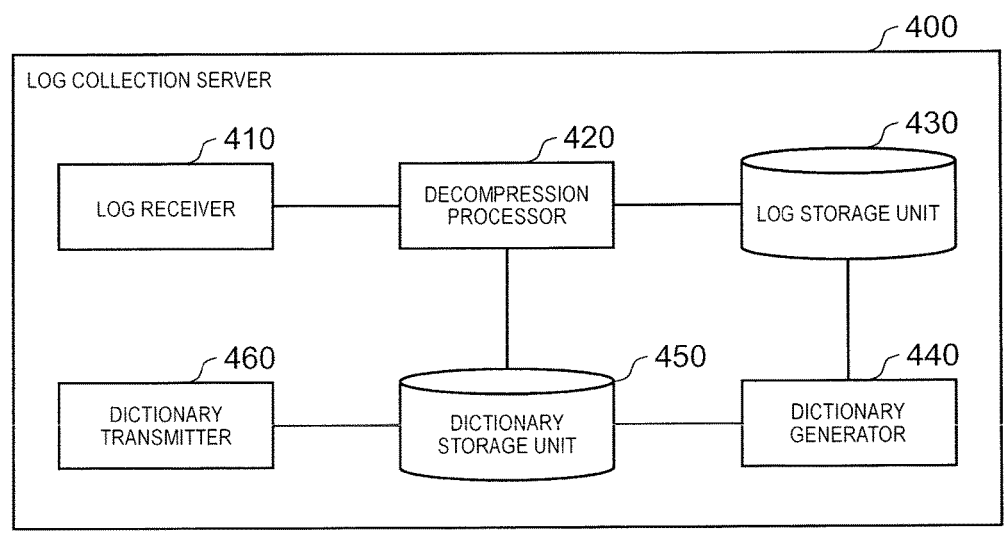
FIG. 4 is a block diagram illustrating an example of a configuration of a log collection server according to this embodiment.

FIG. 4 is a block diagram illustrating an example of a configuration of log collection server 400.

In FIG. 4, log collection server 400 has log receiver 410, decompression processor 420, log storage unit 430, dictionary generator 440, dictionary storage unit 450, and dictionary transmitter 460.

Log receiver 410 receives log data from each of first to Nth log generation devices 200₁ to 200N and outputs the received log data to decompression processor 420.

Log receiver 410 may wait for and receive log data autonomously sent from each log generation device 200 or may receive the log data by requesting transmission of the log data to each log generation device 200. Particularly in the former case, it is preferable that log receiver 410 performs a response indicating whether the log data has been received to log generation device 200 that is a transmission source of the log data.

Decompression processor 420 performs decompression process using the compressed dictionary stored in dictionary storage unit 450 to be described below on the log data output from log receiver 410, and outputs the decompressed (re-stored) log data obtained by such a process to log storage unit 430 in a state where the transmission source identification information is attached.

Log collection server 400 stores the compressed dictionary generated by dictionary generator 440 in dictionary storage unit 450 and transmits the compressed dictionary having the same contents to log generator 210 by dictionary transmitter 460. Therefore, decompression processor 420 performs decompression process on the log data received from log generation device 200 using the same compressed dictionary as the compressed dictionary that is used for compressing log data by log generation device 200.

In a case where there is no compressed dictionary in dictionary storage unit 450, decompression processor 420 outputs the log data output from log receiver 410 to log storage unit 430 as it is. In addition, decompression processor 420 also outputs the log data portion that does not exist in the compressed dictionary stored in dictionary storage unit 450 to log storage unit 430 as it is.

Log storage unit 430 stores and holds the log data output from decompression processor 420 in a case where the identification information of the transmission source is attached thereto. As described above, the log data is received from each of first to Nth log generation devices 200₁ to 200N. Therefore, the log data collected from first to Nth log generation devices 200₁ to 200N are accumulated in log storage unit 430.

Such log data is obtained by restoring the log data before compression generated by each log generation device 200. The log data stored in log storage unit 430 is subjected to statistical analysis and the like in a data analyzer (not illustrated) of log collection server 400, for example.

Based on the log data stored in log storage unit 430, dictionary generator 440 generates a compressed dictionary for performing text compression. Then, dictionary generator 440 outputs the generated compressed dictionary to dictionary storage unit 450.

However, dictionary generator 440 generates a compressed dictionary (hereinafter referred to as "common dictionary") based on the log data of first to Nth log generation devices 200₁ to 200N and a compressed dictionary (hereinafter referred to as "device dictionary") based on the transmitted log data from log generation device 200 for each log generation device 200. In addition, dictionary generator 440 assigns the identification information of log generation device 200 that generates the original log data to each device dictionary.

Dictionary generator 440 appropriately updates the contents of the compressed dictionary stored in dictionary storage unit 450 based on the log data stored in log storage unit 430.

In addition, as a generation method of the compressed dictionary, it is possible to arbitrarily select from various methods. For example, in lexicographic compression in which patterns included in data are coded to compress data, there are two types of methods such as a slide dictionary method and a dynamic dictionary method, as methods of finding a pattern, but any of them may be adopted.

Dictionary storage unit 450 stores and holds the compressed dictionary output from dictionary generator 440. Such a compressed dictionary is used by decompression processor 420 as described above. In addition, dictionary storage unit 450 notifies dictionary transmitter 460 to that effect for each time a new compressed dictionary is stored and for each time the stored compressed dictionary is updated. Dictionary storage unit 450 has sufficient capacity to store one common dictionary and N device dictionaries corresponding to first to Nth log generation devices 200₁ to 200N.

Dictionary transmitter 460 transmits the compressed dictionary stored in dictionary storage unit 450 to log generation device 200 and instructs the text log transmitted after transmission of the compressed dictionary to perform compression process using the compressed dictionary. In addition, each time the compressed dictionary is updated, dictionary transmitter 460 transmits the compressed dictionary after update (or information indicating the update content) to log generation device 200, replaces the compressed dictionary before the update and instructs to use the compressed dictionary after the update.

In addition, although not illustrated, log collection server 400 has, for example, a CPU, a storage medium such as a ROM storing a control program, a work memory such as a RAM, and a communication circuit. In this case, the function of each of the units described above is realized by the CPU executing the control program.

With such a configuration, log collection server 400 can generate a compressed dictionary based on the log data received from each log generation device 200 and cause each log generation device 200 to perform compression process using the compressed dictionary.

<Contents of Compressed Dictionary and Method for Sharing the Contents>

Here, the contents of the compressed dictionary and how to share the contents will be described.

FIG. 5 is a diagram illustrating an example of the contents of the common dictionary.

As illustrated in FIG. 5, common dictionary 510 sets, for example, a combination of dictionary name 511 and version 512 as identification information and describes character string 514 and frequency 515 for each number 513. Version 512 is information indicating an updated version of common dictionary 510. Character string 514 is the character string of the log data to be compressed and frequency 515 is the appearance frequency of the character string. Number 513 is an index number (for example, text described after "0xff") when character string 514 is converted.

For example, character string 514 "rtkit-daemon: [# debug] Sucessfully" "is described in association with number 513 which is "1". This means that in a case where the text which is "rtkit-daemon: [# debug] Sucessfully" exists in the log data, the text is compressed to 2 bytes of 0xf, 0x01.

FIG. 6 is a diagram illustrating an example of the content of the device dictionary.

As illustrated in FIG. 6, for example, device dictionary 520 sets a combination of dictionary name 521, device number 522, and version 523 as identification information, and describes character string 525 and frequency 526 for each number 524. Device number 522 is information indicating the transmission source of the log data which is the basis of generation of device dictionary 520 and is, for example, identification information of log generation device 200. Version 523 is information indicating an updated version of device dictionary 520. Character string 525 is a character string of the log data to be compressed and frequency 526 is the appearance frequency of the character string. Number 524 is an index number (for example, text described after "0xff") when character string 525 is converted.

For example, character string 525 "PC-NSX 6000" is described in association with number 524 which is "1". This indicates that in a case where the text which is "PC-NSX 6000" is present in the log data, the text is compressed to 2 bytes of 0xff, 0x01.

Both common dictionary 510 and device dictionary 520 are preferably sorted in at least one of the order of appearance frequency or alphabetical order from the viewpoint of efficiency of the compression process and decompression process. In addition, dictionary generator 440 preferably limits the maximum size (MaxSizeD) of the generated device dictionary in consideration of the memory size (in device-side dictionary storage unit 250) of each log generation device 200. In addition, in FIG. 5 and FIG. 6 although examples in which identical numbers are associated with different texts are illustrated, with respect to numbers corresponding to different texts (compressed texts), it is desirable for different numbers to be distinguished by additional information.

In this manner, dictionary generator 440 generates a common dictionary which is commonly used by first to Nth log generation devices 2001 to 200N and a device dictionary which is individually used for each log generation device 200. In a case where there are many character strings peculiar to each device, such as the name (hostname) of log generation device 200, and in a case where devices of different series (type, version) are mixed in first to Nth log generation devices 2001 to 200N, the device dictionary demonstrates the effect.

For each log generation device 200, the tendency of character strings frequently used for log data can differ. In addition, even in a case where log collection system 100 is a compressed dictionary generated from the same log data group, the sharing timing may differ for each log generation device 200 due to the power-on state or the like of log generation device 200.

Figure 7:
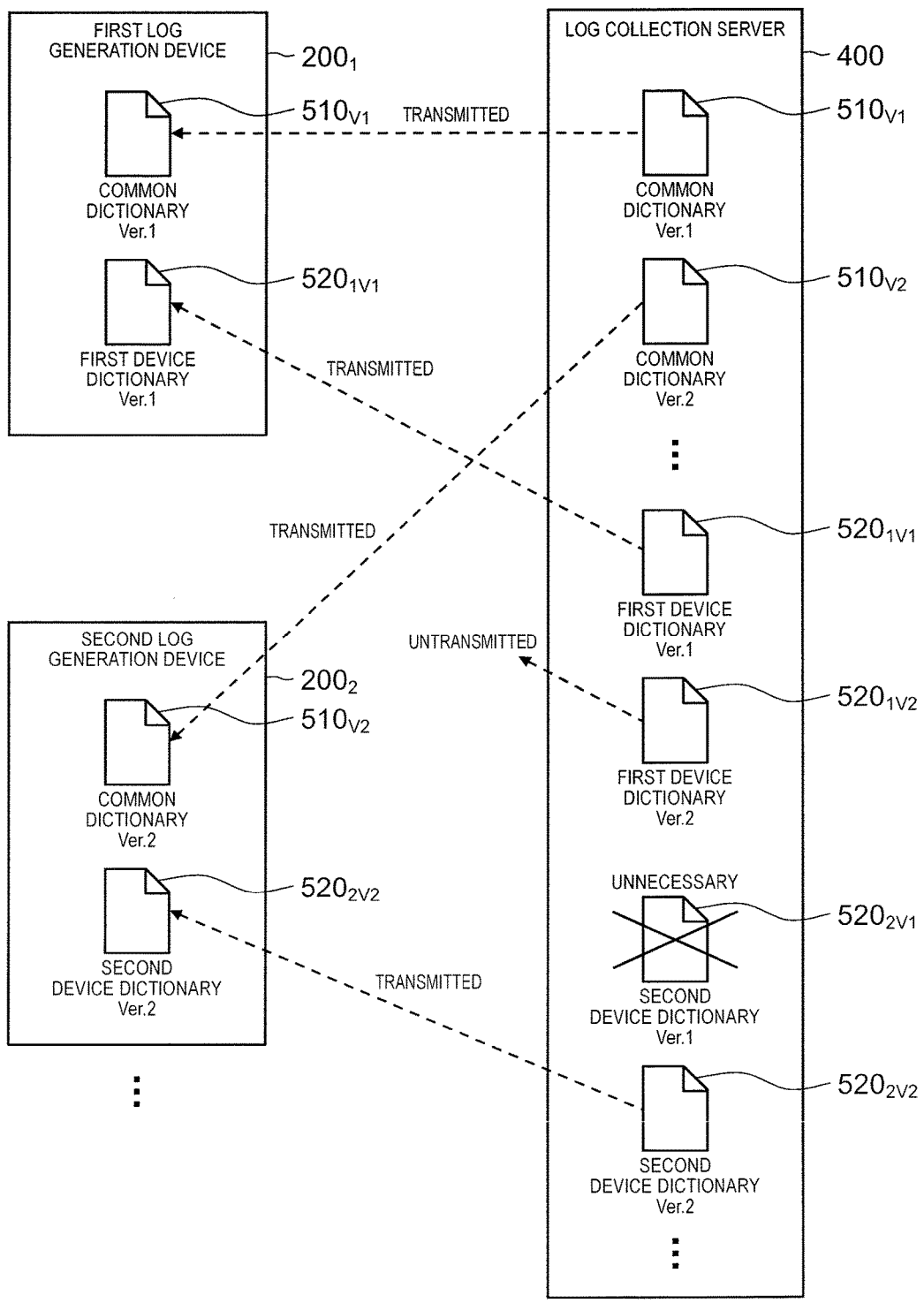
FIG. 7 is a schematic diagram illustrating an example of a dictionary sharing state in this embodiment.

FIG. 7 is a schematic diagram illustrating an example of a dictionary sharing state.

As illustrated in FIG. 7, for example, log collection server 400 generates common dictionary 510V1 of version 1 and then generates common dictionary 510V2 of version 2 which has updated such a dictionary. In addition, after generating first device dictionary 5201V1 of version 1, log collection server 400 generates first device dictionary 5201V2 of version 2 which has updated such a dictionary. Further, after generating second device dictionary 5202V1 of version 1, log collection server 400 generates second device dictionary 5202V2 of version 2 which has updated such a dictionary.

For example, common dictionary 510V2 of version 2 has been transmitted to second log generation device 2002, but only common dictionary 510V1 of version 1 of the old version has been transmitted to first log generation device 2001. First device dictionary 5201V2 of version 2 has been generated but has not yet been transmitted to first log generation device 2001. Second device dictionary 5202V2 of version 2 is transmitted to second log generation device 2002.

Log collection server 400 holds not only the latest dictionary after the update, but also a dictionary that is being used or there is a possibility of use (for example, common dictionary 510V1 of version 1 and device dictionary 5201V1 of version 1).

On the other hand, log collection server 400 deletes a dictionary (for example, second device dictionary 5201V2 of version 1) that is no longer required. Likewise, for example, so that log collection server 400 deletes the common dictionary of version M−1 at the time when transmission of the common dictionary of version M is completed for all of first to Nth log generation devices 2001 to 200N, log collection server 400 deletes unnecessary common dictionary.

The compressed dictionary used for decompression process by log collection server 400 needs to have the same content as the compressed dictionary used at the time of the compression process for the log data to be decompressed.

Therefore, dictionary transmitter 460 transmits a compressed dictionary for each log generation device 200, generates dictionary sharing information that indicates which compressed dictionary has been transmitted to which of first to Nth log generation devices 2001 to 200N, stores the dictionary sharing information in dictionary storage unit 450, and manages the dictionary sharing information. Dictionary transmitter 460 distinguishes the type, log generation device 200 which is a target, and the updated version of the compressed dictionary, and records the transmission history of the compressed dictionary in the dictionary sharing information.

FIG. 8 is a diagram illustrating an example of the contents of the dictionary sharing information.

As illustrated in FIG. 8, dictionary sharing information 530 describes common dictionary (identification information) 533 and device dictionary (identification information) 534 for each set of device name 531 and device number 532. Common dictionary 533 and device dictionary 534 indicate the newest common dictionary and device dictionary transmitted to log generation device 200 indicated by device number 532. Device name 531 is not always necessary.

For example, a common dictionary 533 of "common dictionary Ver. 1" and device dictionary 534 of "first device dictionary Ver. 1" are described in association with device number 532 of "1". This indicates that the latest common dictionary and device dictionary 534 transmitted to first log generation device 200 are the version 1 of the common dictionary and the version 1 of the first device dictionary.

With reference to such dictionary sharing information 530, and for each log generation device 200, with respect to the log data transmitted from log generation device 200, decompression processor 420 determines that the version of the compressed dictionary (before update/after update) is to be used. Accordingly, decompression processor 420 can perform decompression process on the log data by using the same compressed dictionary as the compressed dictionary used at the time of the compression process of the received log data and the original log data can be more reliably restored.

<Operation of Device>

Next, the operation of each device will be described.

Figure 9:
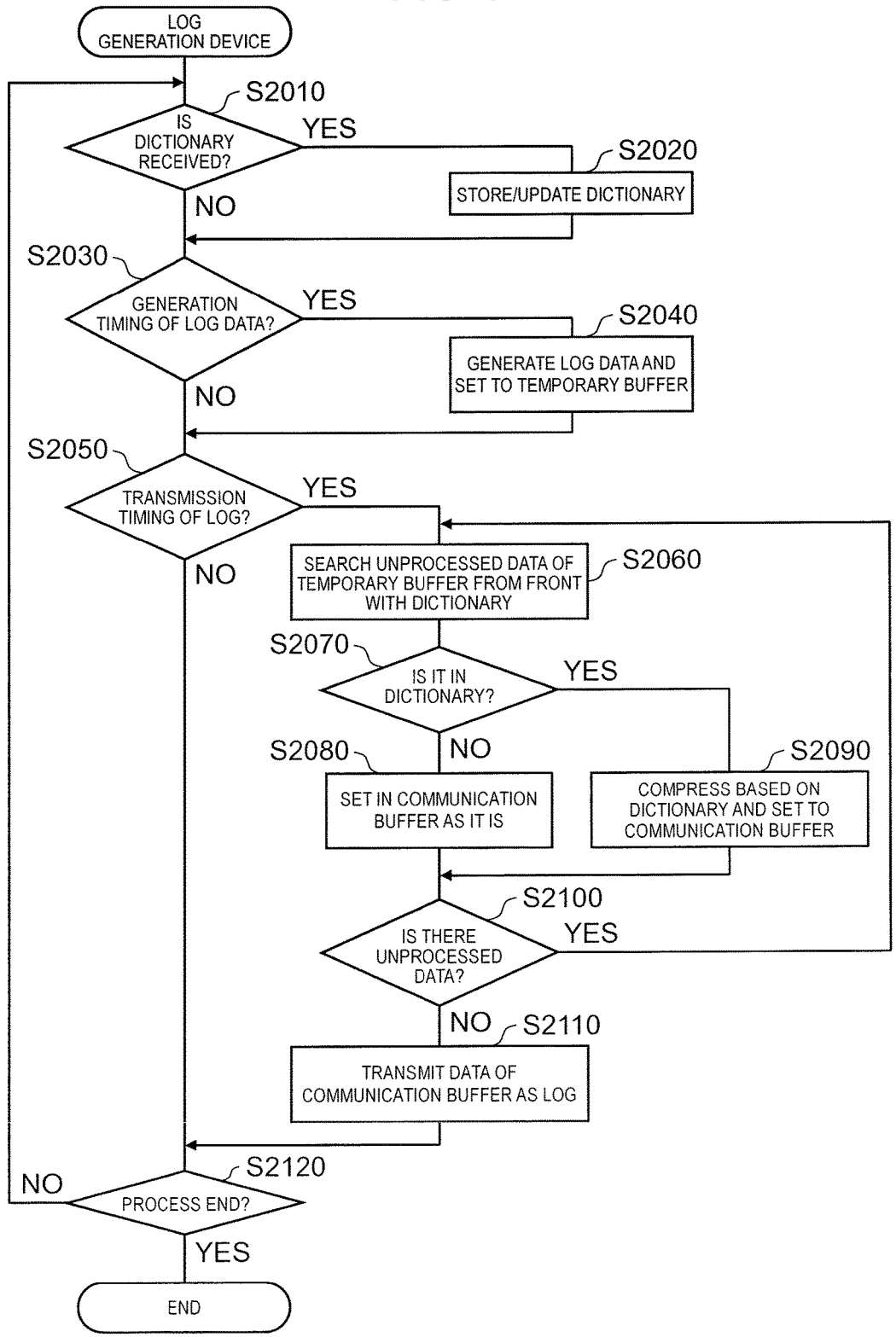
FIG. 9 is a flowchart illustrating an example of an operation of the log generation device according to this embodiment.

FIG. 9 is a flowchart illustrating an example of the operation of log generation device 200.

In step S2010, dictionary receiver 240 determines whether or not the compressed dictionary (common dictionary 510/device dictionary 520, see FIGS. 5 and 6) has been received from log collection server 400.

In a case of receiving the compressed dictionary (S2010: YES), dictionary receiver 240 advances the process to step S2020. In addition, in a case where the compressed dictionary has not been received (S2010: NO), dictionary receiver 240 advances the process to step S2030 to be described below.

In step S2020, device-side dictionary storage unit 250 stores the received compressed dictionary. Alternatively, device-side dictionary storage unit 250 updates the existing same-type compressed dictionary (old version of compressed dictionary) with the received compressed dictionary.

In step S2030, log generator 210 determines whether or not the generation timing of log data has arrived. The timing is at least one of periodic timing such as every 5 seconds, and timing when a predetermined event such as detection of a suspicious person occurs.

In a case where the log data generation timing arrives (S2030: YES), log generator 210 advances the process to step S2040. In addition, in a case where the log data generation timing has not arrived (S2030: NO), log generator 210 advances the process to step S2050 to be described below.

In step S2040, log generator 210 generates log data and sets (outputs to compression processor 220) the log data to the temporary buffer prepared in compression processor 220.

In step S2050, compression processor 220 determines whether or not the transmission timing of the log data has arrived. The timing is at least one of timing at which new log data is generated, periodic timing such as every 5 minutes, and timing at which log data is requested to be transmitted from log collection server 400.

In a case where the transmission timing of the log data has arrived (S2050: YES), compression processor 220 advances the process to step S2060. In addition, in a case where the transmission timing of the log data has not arrived (S2050: NO), compression processor 220 advances the process to step S2120 to be described below.

In step S2060, compression processor 220 searches unprocessed data (text) whose subsequent process in steps S2070 to S2090 has not been performed among the log data set in the temporary buffer from the front in the compressed dictionary stored in device-side dictionary storage unit 250.

In step S2070, compression processor 220 determines whether or not the data portion (text) to be searched has existed in one of the compression dictionaries.

In a case where the data portion to be searched does not exist in any of the compression dictionaries (S2070: NO), compression processor 220 advances the process to step S2080. In addition, in a case where the data portion to be searched exists in any of the compression dictionaries (S2070: YES), compression processor 220 advances the process to step S2090 to be described below.

In step S2080, compression processor 220 sets the data portion to be searched as it is in the communication buffer prepared in log transmitter 230 (outputs to log transmitter 230).

In step S2090, compression processor 220 performs compression process on the data portion to be searched based on the compressed dictionary and sets the obtained data (compressed data) to the communication buffer of log transmitter 230 (outputs to log transmitter 230).

The log data set in the temporary buffer is deleted from the temporary buffer by the process in steps S2070 to S2090.

In step S2100, compression processor 220 determines whether or not unprocessed data exists in the temporary buffer.

In a case where unprocessed data exists (S2100: YES), compression processor 220 returns the process to step S2060. In addition, in a case where there is no unprocessed data (S2100: NO), compression processor 220 advances the process to step S2110.

Compression processor 220 may proceed the process to step S2110 and then return the process to step S2060 for each predetermined time or for each time the data amount of at least one of the data set in the communication buffer reaches a predetermined value.

In step S2110, log transmitter 230 transmits the data set in the communication buffer to log collection server 400 as log data.

In step S2120, dictionary receiver 240 determines whether or not the end of the process is instructed by a user operation or the like.

In a case where the end of the process is not instructed (S2120: NO), the dictionary receiver 240 returns the process to step S2010. In addition, in a case where the end of the process is instructed (S2120: YES), dictionary receiver 240 ends the series of processes.

With such an operation, log generation device 200 can successively acquire the compressed dictionary from log collection server 400, compress the log data using the acquired compressed dictionary, and transmit the compressed log data to log collection server 400.

Figure 10:
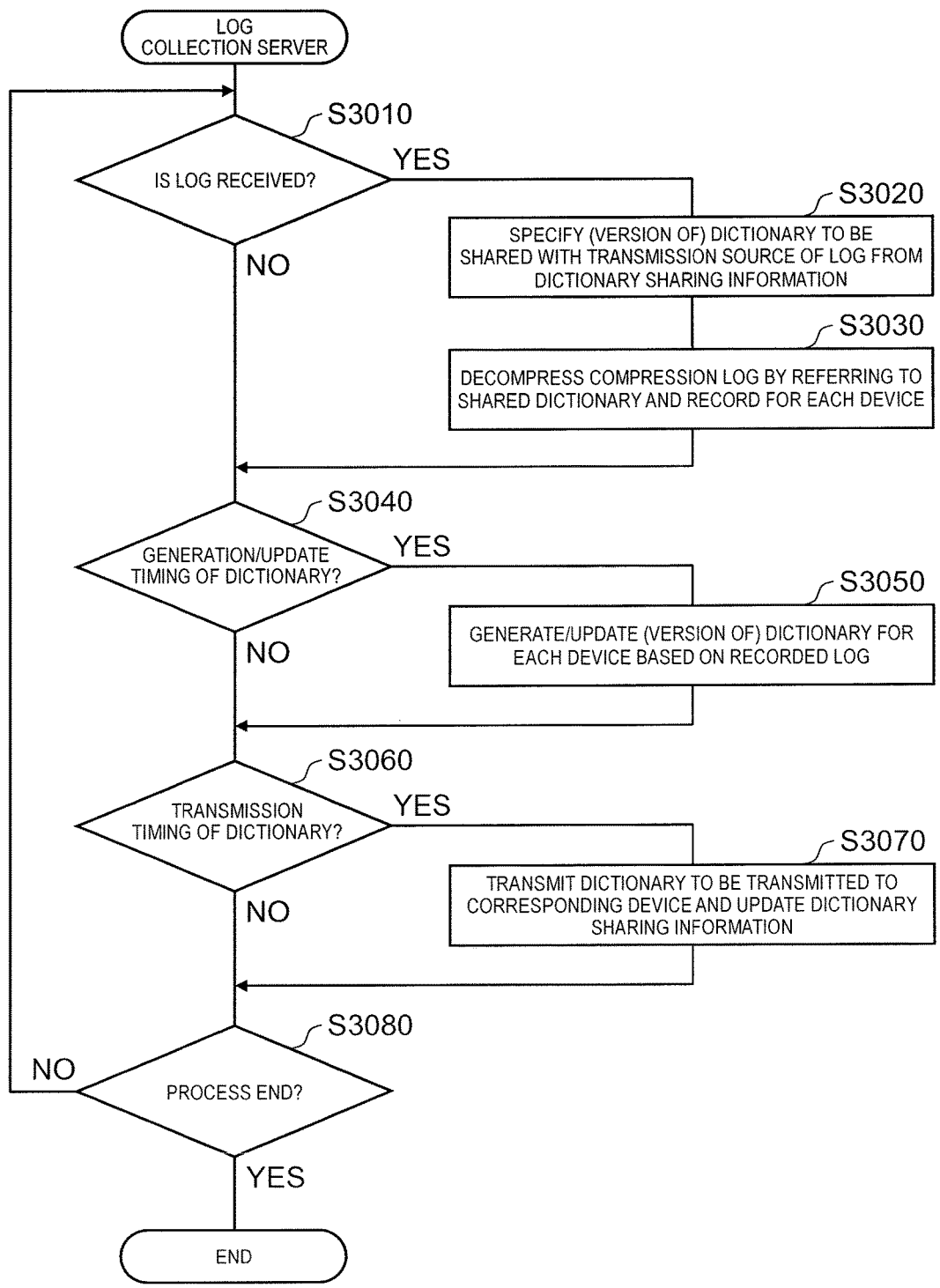
FIG. 10 is a flowchart illustrating an example of an operation of the log collection server according to this embodiment.

FIG. 10 is a flowchart illustrating an example of the operation of log collection server 400.

In step S3010, log receiver 410 determines whether or not log data has been received from any of log generation devices 200. As described above, the reception of such log data may be performed passively or may be performed actively. In the latter case, log receiver 410 requests log generation device 200 to transmit the log data at a periodic timing such as every 5 minutes.

In a case of receiving the log data (S3010: YES), log receiver 410 advances the process to step S3020. In addition, in a case where log data has not been received (S3010: NO), log receiver 410 advances the process to step S3040 to be described below.

In step S3020, decompression processor 420 specifies the compressed dictionary (and version thereof) shared with log generation device 200, which is the transmission source of the received log data from dictionary sharing information 530 stored in dictionary storage unit 450 (see FIG. 8). The transmission source of the log data can be specified from the identification information attached to the log data.

In step S3030, decompression processor 420 refers to the specified shared compressed dictionary, performs decompression process on the compressed log data, and stores (records) the data obtained by the decompression process as original log data in log storage unit 430, respectively. As described above, recording of such log data is performed for each log generation device 200.

In step S3040, dictionary generator 440 determines whether or not generation/update timing of any compressed dictionary has arrived. Such timing includes, for example, at least one of a cumulative data amount of the log data accumulated in log storage unit 430, or timing when the sum of the data amounts of the log data accumulated since the last generation of the compressed dictionary has reached a predetermined value and periodic timings such as for each day.

In a case where the generation/update timing of the compressed dictionary has arrived (S3040: YES), dictionary generator 440 advances the process to step S3050. In addition, in a case where the generation/update timing of the compressed dictionary has not arrived (S3040: NO), dictionary generator 440 advances the process to step S3060 to be described below.

In step S3050, dictionary generator 440 generates or updates (version up) the compressed dictionary based on the log data recorded in log storage unit 430. The range of the log data used for generating or updating the compressed dictionary by dictionary generator 440 may be all from the first data to the latest data or may be a portion thereof. For example, dictionary generator 440 creates or updates the compressed dictionary based on the log data acquired in the most recent one week.

For at least device dictionary 520 (see FIG. 6), it is desirable that dictionary generator 440 performs determination on whether or not the generation/update timing of the compressed dictionary has arrived and generation or updates of the compressed dictionary for each log generation device 200.

In step S3060, dictionary transmitter 460 determines whether or not the transmission timing of the compressed dictionary has arrived. Such timing is, for example, the timing at which a new compressed dictionary is generated or updated.

In a case where the transmission timing of the compressed dictionary arrives (S3060: YES), dictionary transmitter 460 advances the process to step S3070. In addition, in a case where the transmission timing of the compressed dictionary has not arrived (S3060: NO), dictionary transmitter 460 advances the process to step S3080 to be described below.

In step S3070, dictionary transmitter 460 transmits the compressed dictionary to be transmitted, for example, the newly generated or updated compressed dictionary to the corresponding log generation device 200, and updates the dictionary sharing information 530 stored in dictionary storage unit 450 (see FIG. 8). The corresponding log generation device 200 is, for example, the transmission source of the log data used for generating the compressed dictionary to be transmitted, and is first to Nth log generation devices 2001 to 200N in a case of common dictionary 510, and is one of log generation devices 200 in a case of device dictionary 520.

In step S3080, log receiver 410 determines whether or not the end of the process is instructed by a user operation or the like.

In a case where the end of the process is not instructed (S3080: NO), log receiver 410 returns the process to step S3010. In addition, in a case where the end of the processing is instructed (S3080: YES), log receiver 410 ends the series of process.

With such an operation, log collection server 400 sequentially acquires log data from each of first to Nth log generation devices 2001 to 200N, generates a compressed dictionary based on the acquired log data, and can share the generated compressed dictionary to realize compression of transmission data.

Effect of this Embodiment

As described above, log collection server 400 according to this embodiment has log receiver 410 that receives text logs from log generation device 200, and dictionary generator 440 that generates a compressed dictionary for performing text compression based on the received text log. In addition, log collection server 400 has dictionary transmitter 460 that instructs to perform the compression process transmitted after transmission of the compressed dictionary by transmitting the generated compressed dictionary to log generation device 200 and decompression processor 420 that performs decompression process by using the compressed dictionary on the text log received after transmission of the compressed dictionary.

In other words, log collection server 400 has an analysis function for text logs from each log generation device 200, a learning type text dictionary generation function, and a dictionary update function, and automatically creates an efficiently compressed dictionary suitable for the system. By distributing the generated compressed dictionary to each log generation device 200, log collection server 400 can perform the text logs to be transmitted using the same compressed dictionary by each log generation device 200.

Accordingly, log collection server 400 according to this embodiment can transmit a text log of the low load while realizing an effective collection of text logs in a state where an increase in the processing load of log generation device 200 is suppressed.

Modification Example of this Embodiment

Log generation device 200 is not limited to the monitoring camera but may be other various devices that generate text logs.

In addition, the contents, format, and the generation method of the compressed dictionary are not limited to the example described above, and various compression techniques may be used as long as the various techniques can efficiently compress and decompress the original text log in a recoverable manner.

In addition, log collection server 400 is not necessarily required to manage dictionary sharing information indicating which compressed dictionary has been sent to which log generation device 200 (which compressed dictionary is used by each log generation device 200). For example, in a case where log generation device 200 transmits information indicating which compressed dictionary is being used and the compression process is performed to log collection server 400, log collection server 400 may determine the compressed dictionary to be used for decompression process based on the information.

In addition, apart from the transmission of the compressed dictionary, log collection server 400 may instruct log generation device 200 to perform compression process using which of the plurality of transmitted compression dictionaries.

In addition, log collection server 400 may receive log data from only one log generation device 200.

In addition, a portion of the configuration of log collection server 400 may be physically separated from other portions of the configuration of the device. In this case, it is necessary for each of these separated portions to have a communication unit for communicating with each other. Likewise, a portion of the configuration of log generation device 200 may be also physically separated from other portions of the configuration of the device.

<Summary of this Disclosure>

A log collection device according to this disclosure includes a log receiver that receives a text log from a log generation device; a dictionary generator that generates a compressed dictionary for performing text compression based on the received text log; a dictionary transmitter that transmits the generated compressed dictionary to the log generation device and instructs performing of the compression process using the compressed dictionary on the text log transmitted after the transmission of the compressed dictionary; and a decompression processor that performs a decompression process using the compressed dictionary on the text log received after transmission of the compressed dictionary.

In the log collection device, the log receiver may receive the text log from each of a plurality of the log generation devices, the dictionary transmitter may transmit the compressed dictionary for each of the log generation devices, and manage dictionary sharing information indicating whether the compressed dictionary is transmitted to any of the plurality of log generation devices, and the decompression processor may determine whether or not the decompression process is performed using the compressed dictionary on the text log transmitted from the log generation device for each of the log generation devices, with reference to the dictionary sharing information.

In the log collection device, the dictionary generator may generate and update the compressed dictionary based on the text log transmitted from the plurality of log generation devices, and hold the compressed dictionary before update and the compressed dictionary after update, the dictionary transmitter may transmit the compressed dictionary after update to the log generation device, instruct to replace the compressed dictionary before the update with the compressed dictionary after the update, and to use the compressed dictionary after update, distinguish between the compressed dictionary before update and the compressed dictionary after update, and record in the dictionary sharing information, and wherein the decompression processor may determine that any of the compressed dictionaries before the update and the compressed dictionary after the update is to be used with respect to the text log transmitted from the log generation device for each of the log generation devices.

In the log collection device, the dictionary generator may generate the compressed dictionary as a device dictionary based on the text log transmitted from the log generation device for each of the log generation devices, apart from a common dictionary which is the compressed dictionary generated based on the text log transmitted from the plurality of log generation devices, and the decompression processor may perform the decompression process using the common dictionary and the device dictionary of the log generation device for each of the log generation devices.

The log collection device may further include a log storage unit that accumulates the text log after at least one of the received text log or the decompression process has been performed, the dictionary generator may periodically update the compressed dictionary based on the accumulated text log, and the dictionary transmitter may transmit the compressed dictionary after update to the log generation device for each time the compressed dictionary is updated and instruct to replace the compressed dictionary before update with the compressed dictionary after update and use the compressed dictionary after update.

A log generation device according to this disclosure includes a log generator that generates a text log; a log transmitter that transmits the generated text log to a log collection device; a dictionary receiver that receives a compressed dictionary for performing text compression from the log collection device; and a compression processor that performs compression process using the received compressed dictionary on the text log transmitted after receiving the compressed dictionary.

A log collection method according to this disclosure includes a step of receiving a text log from a log generation device; a step of generating a compressed dictionary for performing text compression based on the received text log; a step of transmitting the generated compressed dictionary to the log generation device and instructing to perform a compression process using the compressed dictionary on the text log transmitted after transmission of the compressed dictionary; and a step of performing decompression process using the compressed dictionary on the received text log after transmission of the compressed dictionary.

INDUSTRIAL APPLICABILITY

The log collection device, log generation device, and the log collection method according to this disclosure are useful as a log collection device, a log generation device, and a log collection method that enable low-load text log transmission in a state where an increase in the processing load of log generation device is suppressed.

REFERENCE MARKS IN THE DRAWINGS

100 LOG COLLECTION SYSTEM
200 LOG GENERATION DEVICE
210 LOG GENERATOR
220 COMPRESSION PROCESSOR
230 LOG TRANSMITTER
240 DICTIONARY RECEIVER
250 DEVICE-SIDE DICTIONARY STORAGE UNIT
300 COMMUNICATION NETWORK
400 LOG COLLECTION SERVER

410 LOG RECEIVER
420 DECOMPRESSION PROCESSOR
430 LOG STORAGE UNIT
440 DICTIONARY GENERATOR
450 DICTIONARY STORAGE UNIT
460 DICTIONARY TRANSMITTER

The invention claimed is:

1. A log collection device, comprising:
a log receiver that receives a text log from a log generation device;
a dictionary generator that generates a compressed dictionary for performing text compression based on the received text log;
a dictionary transmitter that transmits the generated compressed dictionary to the log generation device and instructs performing of the compression process using the compressed dictionary on the text log transmitted after the transmission of the compressed dictionary; and
a decompression processor that performs a decompression process using the compressed dictionary on the text log received after transmission of the compressed dictionary,
wherein the log receiver receives the text log from each of a plurality of log generation devices,
wherein the dictionary transmitter transmits the compressed dictionary for each of the plurality of log generation devices, and manages dictionary sharing information indicating whether the compressed dictionary is transmitted to any of the plurality of log generation devices, and
wherein the decompression processor determines whether or not the decompression process is performed using the compressed dictionary on the text log transmitted from the log generation device for each of the plurality of log generation devices, with reference to the dictionary sharing information.

2. The log collection device of claim 1,
wherein the dictionary generator generates and updates the compressed dictionary based on text logs transmitted from the plurality of log generation devices, and holds the compressed dictionary before update and the compressed dictionary after the update,
wherein the dictionary transmitter transmits the compressed dictionary after the update to the log generation device, instructs the log generation device to replace the compressed dictionary before the update with the compressed dictionary after the update, instructs the log generation device to use the compressed dictionary after the update, distinguishes between the compressed dictionary before the update and the compressed dictionary after the update, and records in the dictionary sharing information, and
wherein the decompression processor determines that any of compressed dictionaries before the update and the compressed dictionary after the update is to be used with respect to the text log transmitted from the log generation device for each of the plurality of log generation devices.

3. The log collection device of claim 2,
wherein the dictionary generator generates the compressed dictionary as a device dictionary based on the text log transmitted from the log generation device for each of the plurality of log generation devices, apart from a common dictionary which is the compressed dictionary generated based on the text logs transmitted from the plurality of log generation devices, and wherein the decompression processor performs the decompression process using the common dictionary and the device dictionary of the log generation device for each of the plurality of log generation devices.

4. The log collection device of claim 1, further comprising:
a log storage that accumulates the text log after at least one of the received text log or the decompression process has been performed,
wherein the dictionary generator periodically updates the compressed dictionary based on the accumulated text log, and
wherein the dictionary transmitter transmits the compressed dictionary after update to the log generation device for each time the compressed dictionary is updated, and instructs the log generation device to replace the compressed dictionary before the update with the compressed dictionary after the update and to use the compressed dictionary after the update.

5. A log generation device, comprising:
a log generator that generates a text log;
a log transmitter that transmits the generated text log to a log receiver of a log collection device;
a dictionary receiver that receives, from a dictionary transmitter of the log collection device, a compressed dictionary for performing text compression from the log collection device, the compressed dictionary being generated by a dictionary generator of the log collection device; and
a compression processor that performs a compression process using the received compressed dictionary on the text log transmitted after receiving the compressed dictionary, a decompression processor of the log collection device configured to perform a decompression process using the compressed dictionary on the text log transmitted after the receiving of the compressed dictionary,
wherein the log receiver of the log collection device is configured to receive the text log from each of a plurality of log generation devices,
wherein the dictionary transmitter of the log collection device is configured to transmit the compressed dictionary for each of the plurality of log generation devices, and to manage dictionary sharing information indicating whether the compressed dictionary is transmitted to any of the plurality of log generation devices, and
wherein the decompression processor of the log collection device is further configured o determine whether or not a decompression process is performed using the compressed dictionary on the text log transmitted after the receiving of the compressed dictionary for each of the plurality of log generation devices, with reference to the dictionary sharing information.

6. A log collection method, comprising:
receiving a text log from a log generation device;
generating a compressed dictionary for performing text compression based on the received text log;
transmitting the generated compressed dictionary to the log generation device and instructing the log generation device to perform a compression process using the compressed dictionary on the text log transmitted after transmission of the compressed dictionary; and
performing a decompression process using the compressed dictionary on the text log received after transmission of the compressed dictionary, wherein the text log is received from each of a plurality of log generation devices, wherein the compressed dictionary is transmitted for each of the plurality of log generation devices, and dictionary sharing information indicating whether the compressed dictionary is transmitted to any of the plurality of log generation devices is managed, and wherein whether or not the decompression process is performed using the compressed dictionary on the text log transmitted from the log generation device is determined for each of the plurality of log generation devices, with reference to the dictionary sharing information.

* * * * *